United States Patent
Chen et al.

(10) Patent No.: US 11,134,553 B2
(45) Date of Patent: Sep. 28, 2021

(54) LIGHTING MEMORY DEVICE AND MEMORY MODULE

(71) Applicant: GIGA-BYTE TECHNOLOGY CO.,LTD., New Taipei (TW)

(72) Inventors: Hung-Cheng Chen, New Taipei (TW); Tse-Hsien Liao, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 16/857,175

(22) Filed: Apr. 23, 2020

(65) Prior Publication Data
US 2020/0383191 A1    Dec. 3, 2020

(30) Foreign Application Priority Data

May 28, 2019   (TW) ................................ 108118410

(51) Int. Cl.
*H05B 47/17* (2020.01)
*H05K 1/14* (2006.01)

(52) U.S. Cl.
CPC ............ *H05B 47/17* (2020.01); *H05K 1/141* (2013.01); *H05K 2201/10113* (2013.01); *H05K 2201/10159* (2013.01)

(58) Field of Classification Search
CPC ................................ H05B 47/17; H05K 1/141
See application file for complete search history.

(56) References Cited

U.S. PATENT DOCUMENTS

| 9,723,697 | B1 * | 8/2017 | Cheng ................. H05B 45/20 |
| 9,769,893 | B1 * | 9/2017 | Wu ..................... H05B 47/18 |
| 2010/0001786 | A1 | 1/2010 | Ramachandran et al. |
| 2014/0223032 | A1 * | 8/2014 | Hsieh ................... G11C 5/04 |
| | | | 710/5 |
| 2017/0343198 | A1 * | 11/2017 | Ning ............... G11C 11/40626 |
| 2019/0335570 | A1 * | 10/2019 | Chen .................... H05B 45/46 |

FOREIGN PATENT DOCUMENTS

| CN | 205038966 | 2/2016 |
| JP | 2005018329 | 1/2005 |
| KR | 20090096429 | 9/2009 |
| TW | I592057 | 7/2017 |
| TW | I654521 | 3/2019 |

OTHER PUBLICATIONS

"Search Report of Europe Counterpart Application", dated Oct. 7, 2020, p. 1-p. 8.
"Office Action of Korea Counterpart Application", dated Feb. 24, 2021, with English translation thereof, pp. 1-13.
"Office Action of Japan Counterpart Application", dated Jul. 13, 2021, p. 1-p. 7.

* cited by examiner

*Primary Examiner* — Alexander H Taningco
*Assistant Examiner* — Pedro C Fernandez
(74) *Attorney, Agent, or Firm* — JCIPRNET

(57) ABSTRACT

A lighting memory device and a memory module are provided. A lighting control circuit receives at least one lighting mode selection signal through lighting mode control pins and controls luminous characteristics of a plurality of light sources according to a lighting control mode corresponding to the lighting mode selection signal.

17 Claims, 4 Drawing Sheets

LIGHTING MEMORY DEVICE AND MEMORY MODULE

CROSS-REFERENCE TO RELATED APPLICATION

This application claims the priority benefit of Taiwan patent application serial no. 108118410, filed on May 28, 2019. The entirety of the above-mentioned patent application is hereby incorporated by reference and made a part of this specification.

BACKGROUND

Technical Field

The disclosure relates to a memory device, and particularly to a lighting memory device and a memory module.

Description of Related Art

In recent years, the computer e-sports market is booming. In order to provide better user experience, computer memory manufacturers add light-emitting diodes (LEDs) to a printed circuit board of a memory and enable light to be evenly diffused through a light guide bar of a memory casing, so that the light of the LEDs of the computer memory achieves a gradient effect.

However, the light-emitting diode memory module only enables the light emitted by the memory itself to be even and mild. The memory modules with the LEDs on the market only have luminous effects of turn-on and turn-off changes in a luminous area.

In addition, when more than two LED memory modules are applied together, lighting changes of the memory installed on a motherboard are synchronous, such as synchronized light and shade changes, but it is impossible to cause asynchronous changes of a plurality of memory modules installed on the same motherboard.

SUMMARY

The disclosure is directed to a lighting memory device and a memory module, which may cause a plurality of light sources on each memory module to produce asynchronous luminous effects.

The lighting memory device provided in an embodiment of the disclosure includes a motherboard and a plurality of memory modules. The motherboard includes a basic input/output system module and a plurality of interface card slots. Each of the interface card slots includes a plurality of lighting mode control lines connected to the basic input/output system module. Each of the memory modules includes a circuit substrate, a plurality of lighting mode control pins, a plurality of light sources, and a lighting control circuit. The circuit substrate includes an insertion portion that extends to one side edge of the circuit substrate and is configured for insertion to the interface card slot. The lighting mode control pins are disposed in the insertion portion and respectively coupled to the corresponding lighting mode control lines. The light sources are disposed on the circuit substrate. The lighting control circuit is disposed on the circuit substrate and receives at least one lighting mode selection signal through the lighting mode control pins to control luminous characteristics of the light sources according to a lighting control mode selected by the lighting mode selection signal.

In an embodiment of the disclosure, the lighting mode control pins of each of the memory modules include SA0, SA1, and SA2 pins.

In an embodiment of the disclosure, each of the interface card slots further includes a power line, a clock signal line, and a data signal line, the clock signal line and the data signal line are connected to the basic input/output system module, and each of the memory modules further includes a power pin, a clock pin, a data pin, and a power conversion circuit. The power pin, the clock pin, and the data pin are disposed in the insertion portion and respectively configured to be electrically connected to the power line, the clock signal line, and the data signal line. The power conversion circuit is disposed on the circuit substrate, receives an input power from the interface card slot through the power pin and the power line, and converts the input power to an output power. The lighting control circuit receives the output power from the power conversion circuit and receives a clock signal and a control command from the interface card slot respectively through the clock pin and the data pin, and the lighting control circuit further controls the luminous characteristics of the light sources according to the lighting control mode selected corresponding to the clock signal and the control command.

In an embodiment of the disclosure, in each of the memory modules, the lighting control circuit controls at least one of luminous intensity, turn-on, turn-off, flicker frequencies, and luminous colors of the light sources according to the clock signal, the control command, and the lighting control mode corresponding to the lighting mode selection signal.

In an embodiment of the disclosure, each of the lighting control circuits includes a power control circuit and a selection control circuit. The power control circuit controls luminous intensity, turn-on, turn-off, and flicker frequencies of the light sources according to the clock signal, the control command, and the lighting mode selection signal. The selection control circuit controls luminous colors of the light sources according to the clock signal, the control command, and the lighting mode selection signal.

In an embodiment of the disclosure, in each of the memory modules, each of the light sources includes a plurality of light-emitting units of different colors, and each of the light-emitting units is coupled to the lighting control circuit through a corresponding control pin of the control pins.

In an embodiment of the disclosure, in each of the memory modules, each of the light sources includes red, green, and blue light-emitting units.

In an embodiment of the disclosure, the lighting control modes of the memory modules are not exactly the same.

In an embodiment of the disclosure, in each of the memory modules, the light sources are disposed on another side edge of the circuit substrate opposite to the insertion portion.

In an embodiment of the disclosure, the memory modules are DDR memory modules.

The memory module provided in an embodiment of the disclosure is adapted to be inserted to an interface card slot of a motherboard, the motherboard includes a basic input/output system module, the interface card slot includes a plurality of lighting mode control lines connected to the basic input/output system module, and the memory module includes a circuit substrate, a plurality of lighting mode control pins, a plurality of light sources, and a lighting control circuit. The circuit substrate includes an insertion portion that extends to one side edge of the circuit substrate and is configured for insertion to the interface card slot. The lighting mode control pins are disposed in the insertion portion and respectively coupled to the corresponding lighting mode control lines. The light sources are disposed on the circuit substrate. The lighting control circuit is disposed on the circuit substrate and receives at least one lighting mode selection signal through the lighting mode control pins to control luminous characteristics of the light sources according to a lighting control mode selected by the lighting mode selection signal.

In an embodiment of the disclosure, the lighting mode control pins of the memory module include SA0, SA1, and SA2 pins.

In an embodiment of the disclosure, the interface card slot further includes a power line, a clock signal line, and a data signal line, the clock signal line and the data signal line are connected to the basic input/output system module, and the memory module further includes a power pin, a clock pin, a data pin, and a power conversion circuit. The power pin, the clock pin, and the data pin are disposed in the insertion portion and respectively configured to be electrically connected to the power line, the clock signal line, and the data signal line. The power conversion circuit is disposed on the circuit substrate, receives an input power from the interface card slot through the power pin and the power line, and converts the input power to an output power. The lighting control circuit receives the output power from the power conversion circuit and receives a clock signal and a control command from the interface card slot respectively through the clock pin and the data pin, and the lighting control circuit further controls the luminous characteristics of the light sources according to the lighting control mode selected corresponding to the clock signal and the control command.

In an embodiment of the disclosure, the lighting control circuit controls at least one of luminous intensity, turn-on, turn-off, flicker frequencies, and luminous colors of the light sources according to the clock signal, the control command, and the lighting control mode corresponding to the lighting mode selection signal.

In an embodiment of the disclosure, the lighting control circuit includes a power control circuit and a selection control circuit. The power control circuit controls luminous intensity, turn-on, turn-off, and flicker frequencies of the light sources according to the clock signal, the control command, and the lighting mode selection signal. The selection control circuit controls luminous colors of the light sources according to the clock signal, the control command, and the lighting mode selection signal.

In an embodiment of the disclosure, each of the light sources includes a plurality of light-emitting units of different colors, and each of the light-emitting units is coupled to the lighting control circuit through a corresponding control pin of the control pins.

In an embodiment of the disclosure, each of the light sources includes red, green, and blue light-emitting units.

In an embodiment of the disclosure, the light sources are disposed on another side edge of the circuit substrate opposite to the insertion portion.

In an embodiment of the disclosure, the memory module is a DDR memory module.

Based on the above, the lighting control circuit provided in one or more embodiments of the disclosure may receive at least one lighting mode selection signal through the lighting mode control pins and control the luminous characteristics of the light sources according to the lighting control mode corresponding to the lighting mode selection signal, thus enabling the memory modules to produce asynchronous luminous effects.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
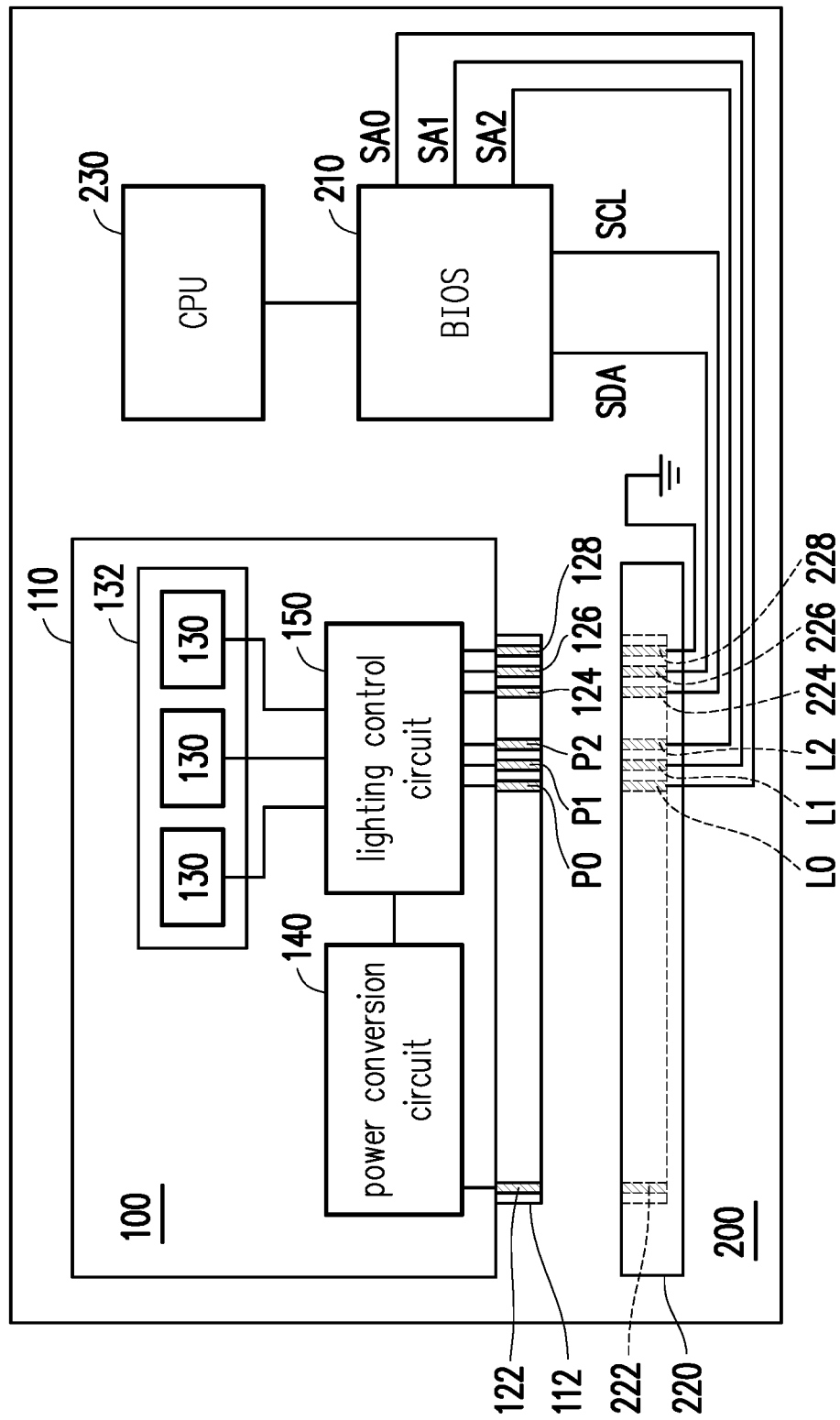
FIG. 1 is a schematic view of a lighting memory device according to an embodiment of the disclosure.

FIG. 1 is a schematic view of a lighting memory device according to an embodiment of the disclosure. The light memory device includes a plurality of memory modules 100 and a motherboard 200. For ease of description, only one memory module 100 is illustrated in FIG. 1. The motherboard 200 includes a basic input/output system (BIOS) module 210, an interface card slot 220, a central processing unit (CPU) 230, and necessary electronic circuit elements (not shown) forming the motherboard 200. The CPU 230 and the necessary electronic circuit elements, as common knowledge in the art of the motherboard 200, may be implemented by those of ordinary skill in the art according to the prior art, and thus their implementation details are not described here. In addition, the memory module may be, for example, a DDR memory module, but is not limited thereto. The memory module 100 may also a dummy card for protecting the interface card slot 220, but does not have complex functions of a memory card.

As shown in FIG. 1, the interface card slot 220 includes at least a power line 222, a clock signal line 224, a data signal line 226, a ground line 228, and a plurality of lighting mode control lines L0-L2, and the clock signal line 224, the data signal line 226, and the lighting mode control lines L0-L2 are connected to the BIOS module 210. The motherboard 200 may output an input power through the power line 222, output a clock signal SCL through the clock signal line 224, and output a control command SDA through the data signal line 226.

In addition, the memory module 100 includes a circuit substrate 110, a power pin 122, a clock pin 124, a data pin 126, a ground pin 128, a plurality of lighting mode control pins P0-P2, a plurality of light sources 130, a power conversion circuit 140, and a lighting control circuit 150.

As shown in FIG. 1, the circuit substrate 110 includes an insertion portion 112 that extends to one side edge of the circuit substrate 110. The power pin 122, the clock pint 124, the data pin 126, the ground pin 128, and the lighting mode control pins P0-P2 are disposed in the insertion portion 112 respectively, and relative positions between the pins correspond to relative positions between the power line 222, the clock signal line 224, the data signal line 226, the ground line 228, and the lighting mode control lines L0-L2. The insertion portion 112 may be inserted into the interface card slot 220 to electrically connect the power pin 122, the clock pint 124, the data pin 126, the ground pin 128, and the lighting mode control pins P0-P2 with the power line 222, the clock signal line 224, the data signal line 226, the ground line 228, and the lighting mode control lines L0-L2 corresponding thereto. The insertion portion 112 extends to the circuit substrate 110 to be integrally formed with the circuit substrate 110. In a specific embodiment, the insertion portion 112 is an edge connector, also referred to as a gold finger.

Figure 2A:
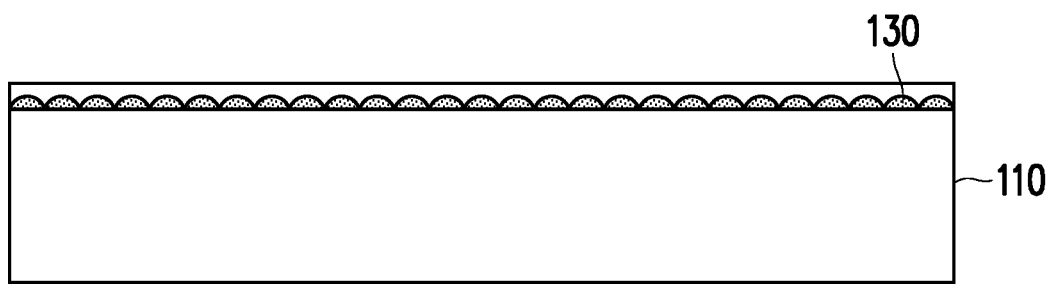
FIG. 2A and FIG. 2B are schematic views of configuration of a plurality of light sources on a circuit substrate according to an embodiment of the disclosure.
Figure 2B:

FIG. 2A and FIG. 2B are schematic views of configuration of a plurality of light sources on a circuit substrate according to an embodiment of the disclosure. FIG. 2A is a side view of the circuit substrate 110, and FIG. 2B is a top view of the circuit substrate 110. As shown in FIG. 2A and FIG. 2B, the light sources 130 may be disposed on another side edge of the circuit substrate 110 opposite to the insertion portion 112 and on the front and back of the circuit substrate 110. The light sources 130 may be arranged in a straight line along the side edge, but are not limited thereto, and they may also be arranged according to a particular decoration requirement in other embodiments. Each of the light sources 130 may include light-emitting units (not shown) of different colors (such as red, green, and blue), and may emit light of different colors, respectively. A specific implementation of the light source 130 may be, for example, a light-emitting diode (LED), an organic light-emitting diodes (OLEDs), a small bulb, or an electroluminescence device, but is not limited thereto. The light sources 130 may also be, for example, disposed on another secondary card 132 as in the embodiment of FIG. 1. The secondary card 132 is detachably disposed on the circuit substrate 110, and thus the light sources 130 may be replaced quickly.

A circuit conversion circuit 140 is disposed on the circuit substrate 110 and electrically connected to the power pin 122 to receive an input power through the power pin 122 and the power line 222 of the interface card slot 220 and convert the input power to an output power. The circuit conversion circuit 140 is generally a DC to DC converter, but an AC adaptor is not excluded. When the interface card slot 220 is a PCI Express slot (PCIe Slot), the input power may have a voltage of, for example, 3.3 V or 12 V. When the interface card slot 220 is a DDR SDRAM slot, the input power may have a voltage of, for example, 2.5 V. Since the voltages may not meet the requirements of the light sources 130, the input power needs to be converted through the power conversion circuit 140 to an output power whose voltage meets the requirements of the light sources 130.

A lighting control circuit 150 is disposed on the circuit substrate 110 and electrically connected to the power conversion circuit 140, the light sources 130, the clock pin 124, the data pin 126, the ground pin 128, and the lighting mode control pins P0-P2. In the present embodiment, the interface card slot 220 is a DDR SDRAM slot, and the lighting mode control pins P0, P1, and P2 are SA0, SA1, and SA2 pins respectively, but are not limited thereto. In other embodiments, the lighting mode control pins P0, P1, and P2 may also be other pins. In addition, the number of the lighting mode control pins is not limited thereto. That is, there may be one or more lighting mode selection signals. When SA0, SA1, and SA2 pins are used as the lighting mode control pins P0, P1, and P, one of the advantages is that the SA0, SA1, and SA2 pins are pins having a universal standard in the DDR SDRAM slot; therefore, when the memory module 100 is applied to different motherboards, the memory module 100 may be high compatible without the need to define pins specifically for different motherboards. In partial embodiments, a plurality of lighting modes may be built in the lighting control circuit 150 by firmware or plug-in memory to allow the lighting control circuit 150 to control lighting of the light sources 130 according to settings of the lighting modes.

The lighting control circuit 150 may receive an output power from the power conversion circuit 140 and drive the light sources 130 according to the clock signal SCL, the control command SDA, and lighting mode selection signals SA0-SA2 from the interface card slot 220. For example, the lighting control circuit may control at least one of luminous intensity, turn-on, turn-off, flicker frequencies, and luminous characteristics (such as flicker frequencies and luminous colors) of the light sources 130 according to the clock signal SCL, the control command SDA, and lighting control modes corresponding to the lighting mode selection signals SA0-SA2. The clock signal SCL, the control command SDA, and the lighting mode selection signals SA0-SA2 are sent by the BIOS module 210 and output to the memory module 100 through the clock signal line 224, the data signal line 226, and the lighting mode control lines L0-L2 respectively. The setting of the lighting modes may be recorded in the firmware of the BIOS module 210 in the form of, for example, program code. The BIOS module 210 may be controlled by the CPU 230 to transmit the setting to the lighting control circuit 150 through the data signal line 226, the control command SDA, and the lighting mode selection signals SA0-SA2.

Figure 3:
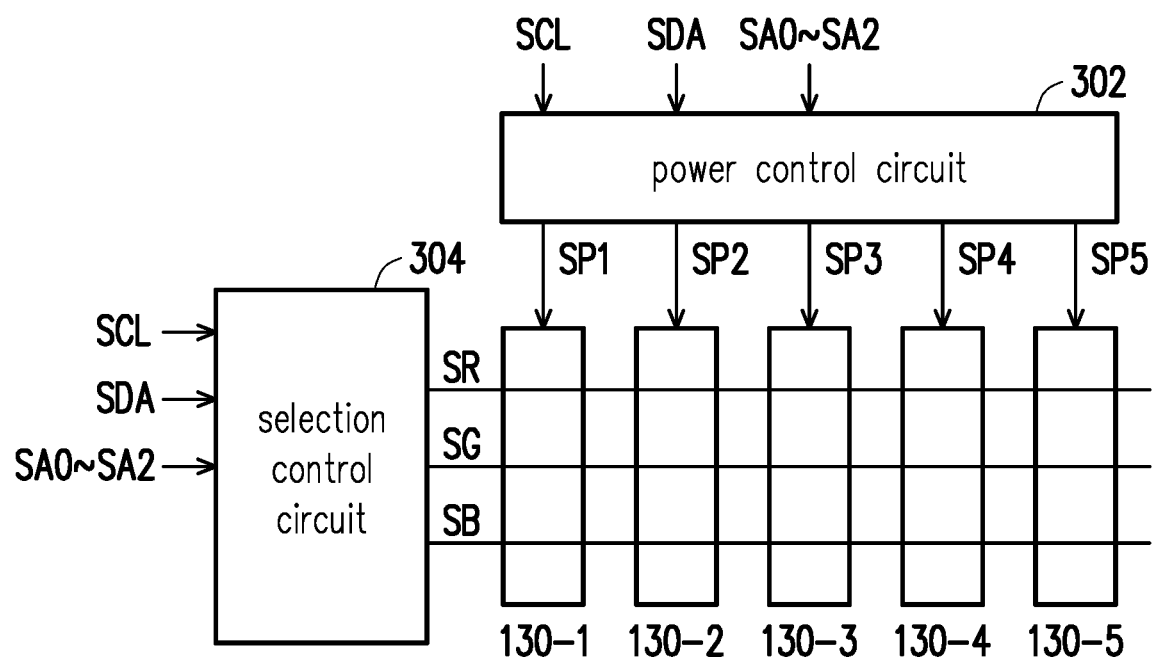
FIG. 3 is a schematic view of a lighting control circuit driving light sources according to an embodiment of the disclosure.

Further, the lighting control circuit 150 may include, as shown in FIG. 3, a power control circuit 302 and a selection control circuit 304. The power control circuit 302 may be connected to the power conversion circuit 140 to receive an output power and control luminous intensity, turn-on, turn-off, and flicker frequencies of the light sources 130 according to the clock signal SCL, the control command SDA, and the lighting mode selection signals SA0-SA2. The clock signal SCL may be used as a reference for calculating time when the power control circuit 302 operates, and the control command SDA may instruct the power control circuit 302 to determine turn-on, turn-off time, flicker frequencies, and luminous intensity of the light sources 130. For example, in FIG. 3, the power control circuit 302 may determine turn-on, turn-off time, flicker frequencies, and luminous intensity of light sources 130-1 to 130-5 by adjusting the magnitude of voltages of power signals SP1-SP5 provided to the light sources 130-1 to 130-5. The lighting mode selection signals SA0-SA2 may indicate a lighting mode of the power control circuit 302 of each memory module 100. That is, the memory module 100 may have different lighting modes through the lighting mode selection signals SA0-SA2; for example, different memory modules 100 may have different flicker frequencies and luminous intensity at the same time or part of the memory modules 100 may have different flicker frequencies and luminous intensity at the same time.

Similarly, the selection control circuit 304 may control luminous colors of the light sources according to the clock signal SCL, the control command SDA, and the lighting mode selection signals SA0-SA2. The clock signal SCL may be used as a reference for calculating time when the selection control circuit 304 operates, and the control command SDA may instruct the selection control circuit 304 to determine luminous colors of the light sources 130. For example, in FIG. 3, the light sources 130 may include three light-emitting units (not shown) of different colors, such as red, green, and blue, each of which may be coupled to the selection control circuit 304 through corresponding control pins SR, SG, and SB. The selection control circuit 304 may adjust luminous colors of the light sources 130-1 to 130-5 by choosing to drive the control pin SR, SG, or SB. The lighting mode selection signals SA0-SA2 may indicate a lighting mode of the selection control circuit 304 of each memory module 100. For example, different memory modules 100 may be of different colors at the same time or part of the memory modules 100 may be of different colors at the same time.

Figure 4:
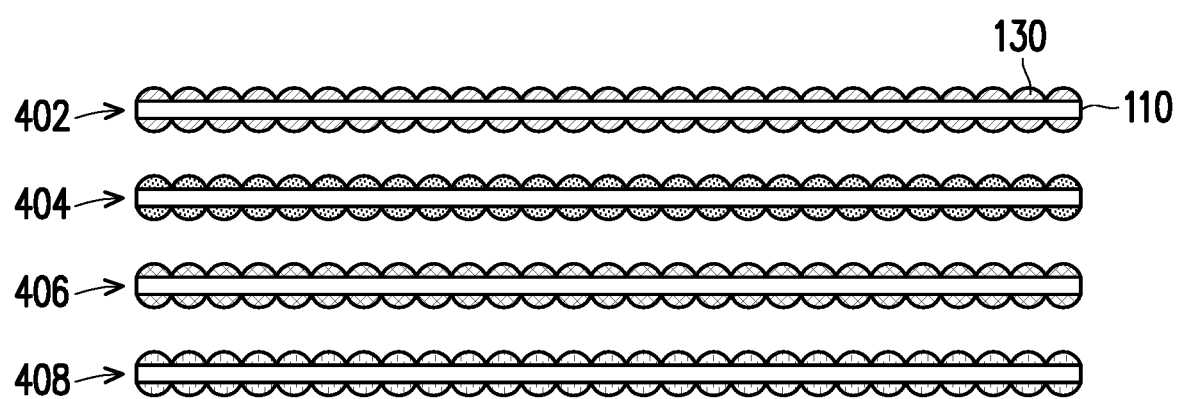
FIG. 4 is a schematic view of lighting of a plurality of memory modules according to an embodiment of the disclosure.

For example, a schematic view of lighting of a plurality of memory modules according to an embodiment of the disclosure is illustrated in FIG. 4. In the embodiment of FIG. 4, memory modules 402-404 are arranged side by side. As described in the above embodiment, through the control of the clock signal SCL, the control command SDA, and the lighting mode selection signals SA0-SA2, the memory modules 402-404 may emit light of different colors, and may also emit light with different luminous intensity and luminous frequencies. In partial embodiments, by appropriately adjusting luminous characteristics of the light sources 130 on the memory modules 402-404, the memory modules 402-404 may further cooperatively display particular patterns or other dynamic display effects, enabling the lighting memory device to have more varied lighting effects.

To sum up, the lighting control circuit provided in one or more embodiments of the disclosure may receive at least one lighting mode selection signal through the lighting mode control pins and control the luminous characteristics of the light sources according to the lighting control mode corresponding to the lighting mode selection signal, so as to enable the memory modules to produce asynchronous luminous effects. In this way, by appropriately adjusting the luminous characteristics of the memory modules, the memory modules may cooperatively display particular patterns or achieve other dynamic display effects, enabling the lighting memory device to accomplish more diverse lighting effects.

It will be apparent to those skilled in the art that various modifications and variations can be made to the disclosed embodiment without departing from the scope or spirit of the disclosure. In view of the foregoing, it is intended that the disclosure covers modifications and variations provided that they fall within the scope of the following claims and their equivalents.

What is claimed is:

1. A lighting memory device, comprising:
    a motherboard, comprising:
        a basic input/output system module; and
        a plurality of interface card slots, each comprising a plurality of lighting mode control lines connected to the basic input/output system module; and
    a plurality of memory modules, each comprising:
        a circuit substrate, comprising an insertion portion that extends to one side edge of the circuit substrate and is configured for insertion to one of the interface card slots;
        a plurality of lighting mode control pins, disposed in the insertion portion and respectively coupled to the corresponding lighting mode control lines;
        a plurality of light sources, disposed on the circuit substrate; and
        a lighting control circuit, disposed on the circuit substrate and receiving at least one lighting mode selection signal through the lighting mode control pins to control luminous characteristics of the light sources according to a lighting control mode selected by the at least one lighting mode selection signal,
    wherein each of the interface card slots further comprises a power line, a clock signal line, and a data signal line, the clock signal line and the data signal line are connected to the basic input/output system module, and each of the memory modules further comprises:
        a power pin, a clock pin, and a data pin that are disposed in the insertion portion and respectively configured to be electrically connected to the power line, the clock signal line, and the data signal line; and
        a power conversion circuit, disposed on the circuit substrate, receiving an input power from the interface card slot through the power pin and the power line, and converting the input power to an output power, the lighting control circuit receiving the output power from the power conversion circuit and receiving a clock signal and a control command from the interface card slot respectively through the clock pin and the data pin, the lighting control circuit further controlling the luminous characteristics of the light sources according to the lighting control mode selected corresponding to the clock signal and the control command,
    wherein the at least one lighting mode selection signal indicates the lighting control mode of each of the memory modules, the clock signal is used as a reference for calculating time when each of the lighting control circuits operates, and the control command instructs each of the lighting control circuits to determine turn-on, turn-off time, flicker frequencies, and luminous intensity of the light sources,
    wherein the clock signal, the control command, and the at least one lighting mode selection signal are sent by the basic input/output system module and output to each of the memory modules through the clock signal line, the data signal line, and at least one lighting mode control lines respectively.

2. The lighting memory device according to claim 1, wherein the lighting mode control pins of each of the memory modules comprise SA0, SA1, and SA2 pins.

3. The lighting memory device according to claim 1, wherein in each of the memory modules, the lighting control circuit controls at least one of luminous intensity, turn-on, turn-off, flicker frequencies, and luminous colors of the light sources according to the clock signal, the control command, and the lighting control mode corresponding to the at least one lighting mode selection signal.

4. The lighting memory device according to claim 1, wherein each of the lighting control circuits comprises:
    a power control circuit, controlling luminous intensity, turn-on, turn-off, and flicker frequencies of the light sources according to the clock signal, the control command, and the at least one lighting mode selection signal; and
    a selection control circuit, controlling luminous colors of the light sources according to the clock signal, the control command, and the at least one lighting mode selection signal.

5. The lighting memory device according to claim 1, wherein in each of the memory modules, each of the light sources comprises a plurality of light-emitting units of different colors, and each of the light-emitting units is coupled to the lighting control circuit through a corresponding control pin of the control pins.

6. The lighting memory device according to claim 5, wherein in each of the memory modules, each of the light sources comprises red, green, and blue light-emitting units.

7. The lighting memory device according to claim 1, wherein the lighting control modes of the memory modules are not exactly the same.

8. The lighting memory device according to claim 1, wherein each of the memory modules, the light sources are disposed on another side edge of the circuit substrate opposite to the insertion portion.

9. The lighting memory device according to claim 1, wherein the memory modules are DDR memory modules.

10. A memory module, adapted to be inserted to an interface card slot of a motherboard, the motherboard comprising a basic input/output system module, the interface card slot comprising a plurality of lighting mode control lines connected to the basic input/output system module, the memory module comprising:
    a circuit substrate, comprising an insertion portion that extends to one side edge of the circuit substrate and is configured for insertion to the interface card slot;
    a plurality of lighting mode control pins, disposed in the insertion portion and respectively coupled to the corresponding lighting mode control lines;
    a plurality of light sources, disposed on the circuit substrate; and
    a lighting control circuit, disposed on the circuit substrate and receiving at least one lighting mode selection signal through the lighting mode control pins to control luminous characteristics of the light sources according to a lighting control mode selected by the at least one lighting mode selection signal,
    wherein the interface card slot further comprises a power line, a clock signal line, and a data signal line, the clock signal line and the data signal line are connected to the basic input/output system module, and the memory module further comprises:
        a power pin, a clock pin, and a data pin that are disposed in the insertion portion and respectively configured to be electrically connected to the power line, the clock signal line, and the data signal line; and
        a power conversion circuit, disposed on the circuit substrate, receiving an input power from the interface card slot through the power pin and the power line, and converting the input power to an output power, the lighting control circuit receiving the output power from the power conversion circuit and receiving a clock signal and a control command from the interface card slot respectively through the clock pin and the data pin, the lighting control circuit further controlling the luminous characteristics of the light sources according to the lighting control mode selected corresponding to the clock signal and the control command,
    wherein the at least one lighting mode selection signal indicates the lighting control mode of each of the memory modules, the clock signal is used as a reference for calculating time when each of the lighting control circuits operates, and the control command instructs each of the lighting control circuits to determine turn-on, turn-off time, flicker frequencies, and luminous intensity of the light sources,
    wherein the clock signal, the control command, and the at least one lighting mode selection signal are sent by the basic input/output system module and output to each of the memory modules through the clock signal line, the data signal line, and at least one lighting mode control lines respectively.

11. The memory module according to claim 10, wherein the lighting mode control pins comprise SA0, SA1, and SA2 pins.

12. The memory module according to claim 10, wherein the lighting control circuit controls at least one of luminous intensity, turn-on, turn-off, flicker frequencies, and luminous colors of the light sources according to the clock signal, the control command, and the lighting control mode corresponding to the at least one lighting mode selection signal.

13. The memory module according to claim 10, wherein e lighting control circuit comprises:
    a power control circuit, controlling luminous intensity, turn-on, turn-off, and flicker frequencies of the light sources according to the clock signal, the control command, and the at least one lighting mode selection signal; and
    a selection control circuit, controlling luminous colors of the light sources according to the clock signal, the control command, and the at least one lighting mode selection signal.

14. The memory module according to claim 10, wherein each of the light sources comprises a plurality of light-emitting units of different colors, and each of the light-emitting units is coupled to the lighting control circuit through a corresponding control pin of the control pins.

15. The memory module according to claim 10, wherein each of the light sources comprises red, green, and blue light-emitting units.

16. The memory module according to claim 10, wherein the light sources are disposed on another side edge of the circuit substrate opposite to the insertion portion.

17. The memory module according to claim 10, wherein the memory module is a DDR memory module.

\* \* \* \* \*